United States Patent
Cho et al.

(10) Patent No.: US 11,035,904 B2
(45) Date of Patent: Jun. 15, 2021

(54) BATTERY CONTROL APPARATUS AND METHOD FOR DETECTING INTERNAL SHORT OF BATTERY

(71) Applicant: SAMSUNG SDI CO., LTD., Yongin-si (KR)

(72) Inventors: Young Shin Cho, Yongin-si (KR); Yoonphil Eo, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 48 days.

(21) Appl. No.: 16/517,257

(22) Filed: Jul. 19, 2019

(65) Prior Publication Data
US 2020/0025832 A1  Jan. 23, 2020

(30) Foreign Application Priority Data

Jul. 23, 2018 (KR) .......................... 10-2018-0085589
Jul. 10, 2019 (KR) .......................... 10-2019-0083344

(51) Int. Cl.
*G01R 31/3842* (2019.01)
*G01R 31/392* (2019.01)

(52) U.S. Cl.
CPC ....... *G01R 31/3842* (2019.01); *G01R 31/392* (2019.01)

(58) Field of Classification Search
None
See application file for complete search history.

(56) References Cited

U.S. PATENT DOCUMENTS

| | | | |
|---|---|---|---|
| 9,097,774 B2 | 8/2015 | White et al. | |
| 2005/0110466 A1* | 5/2005 | Shoji | G01R 31/3842 320/150 |
| 2009/0155674 A1 | 6/2009 | Ikeuchi et al. | |
| 2010/0188054 A1* | 7/2010 | Asakura | H01M 4/136 320/161 |
| 2010/0194398 A1* | 8/2010 | Kawasumi | H01M 10/42 324/430 |
| 2011/0199054 A1 | 8/2011 | Burchardt et al. | |

(Continued)

FOREIGN PATENT DOCUMENTS

| | | |
|---|---|---|
| JP | 2003-153436 A | 5/2003 |
| JP | 2009-170397 A | 7/2009 |

(Continued)

OTHER PUBLICATIONS

Taiwanese Patent Office Action for corresponding Taiwanese Patent Application No. 108125831, dated Jun. 5, 2020, and the accompanying Search Report dated Jun. 2, 2020, 16 pages.

(Continued)

*Primary Examiner* — Jas A Sanghera
(74) *Attorney, Agent, or Firm* — Lewis Roca Rothgerber Christie LLP

(57) ABSTRACT

In a method for detecting an internal short of a battery, the method includes: measuring a voltage of a battery a plurality of times; and determining whether or not the internal short of the battery occurs based on a difference between a first voltage value of the battery during a first time period and a second voltage value of the battery during a second time period when the battery is in constant current charging, wherein the second time period is a time period after the first time period.

42 Claims, 9 Drawing Sheets

(56) References Cited

U.S. PATENT DOCUMENTS

| | | | |
|---|---|---|---|
| 2016/0377667 A1* | 12/2016 | Friedrich | ........... G01R 31/3842 |
| | | | 324/434 |
| 2017/0155255 A1 | 6/2017 | Ono | |
| 2017/0259687 A1 | 9/2017 | Chikkannanavar et al. | |
| 2018/0095137 A1* | 4/2018 | Yoshioka | ......... G01R 19/16542 |
| 2020/0200834 A1* | 6/2020 | Uchino | ................ G01R 31/396 |

FOREIGN PATENT DOCUMENTS

| | | | |
|---|---|---|---|
| JP | 2016-197054 A | 11/2016 | |
| KR | 10-2010-0050514 A | 5/2010 | |
| KR | 10-1536220 B1 | 7/2015 | |
| TW | 201030359 A1 | 8/2010 | |
| TW | 201725823 A | 7/2017 | |

OTHER PUBLICATIONS

EPO Extended Search Report dated Nov. 5, 2019, for corresponding European Patent Application No. 19187823.0 (9 pages).

Korean Office Action dated Aug. 27, 2020, issued in corresponding Korean Patent Application No. 10-2019-0083344 (8 pages).

\* cited by examiner

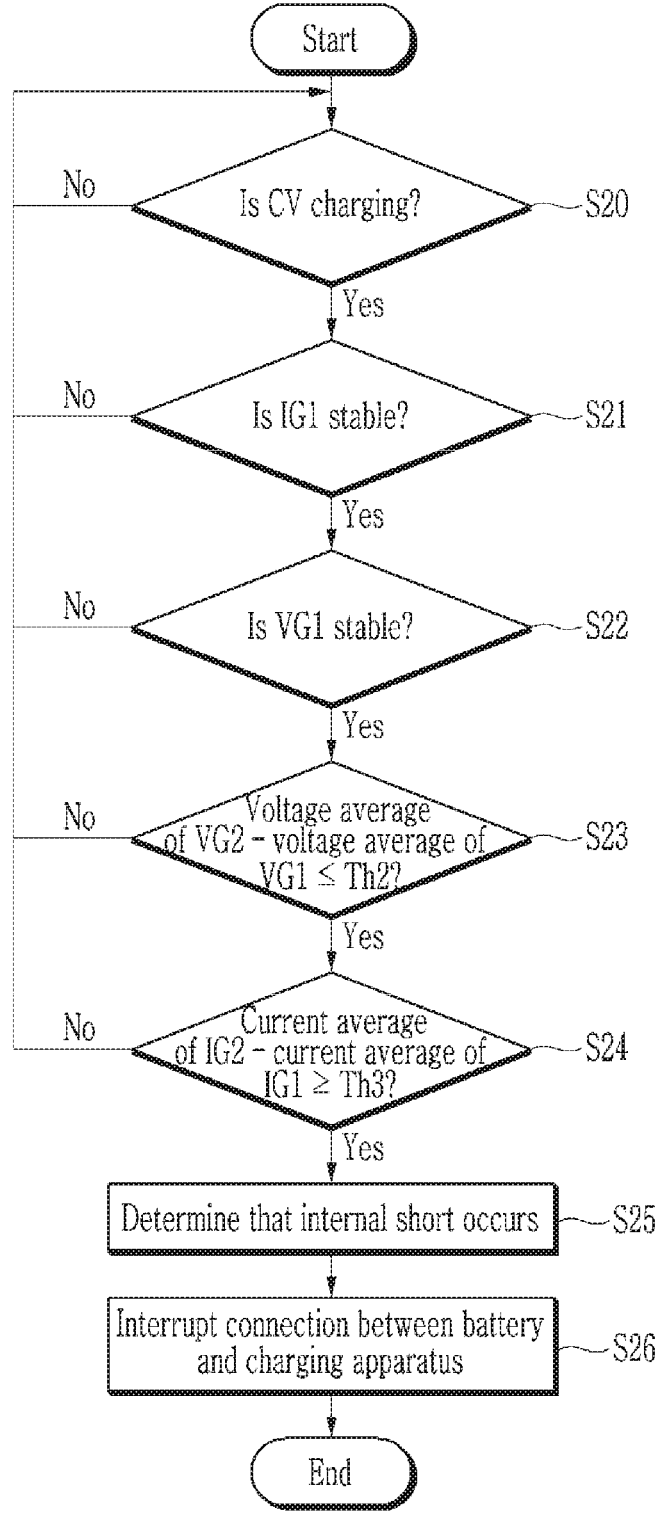

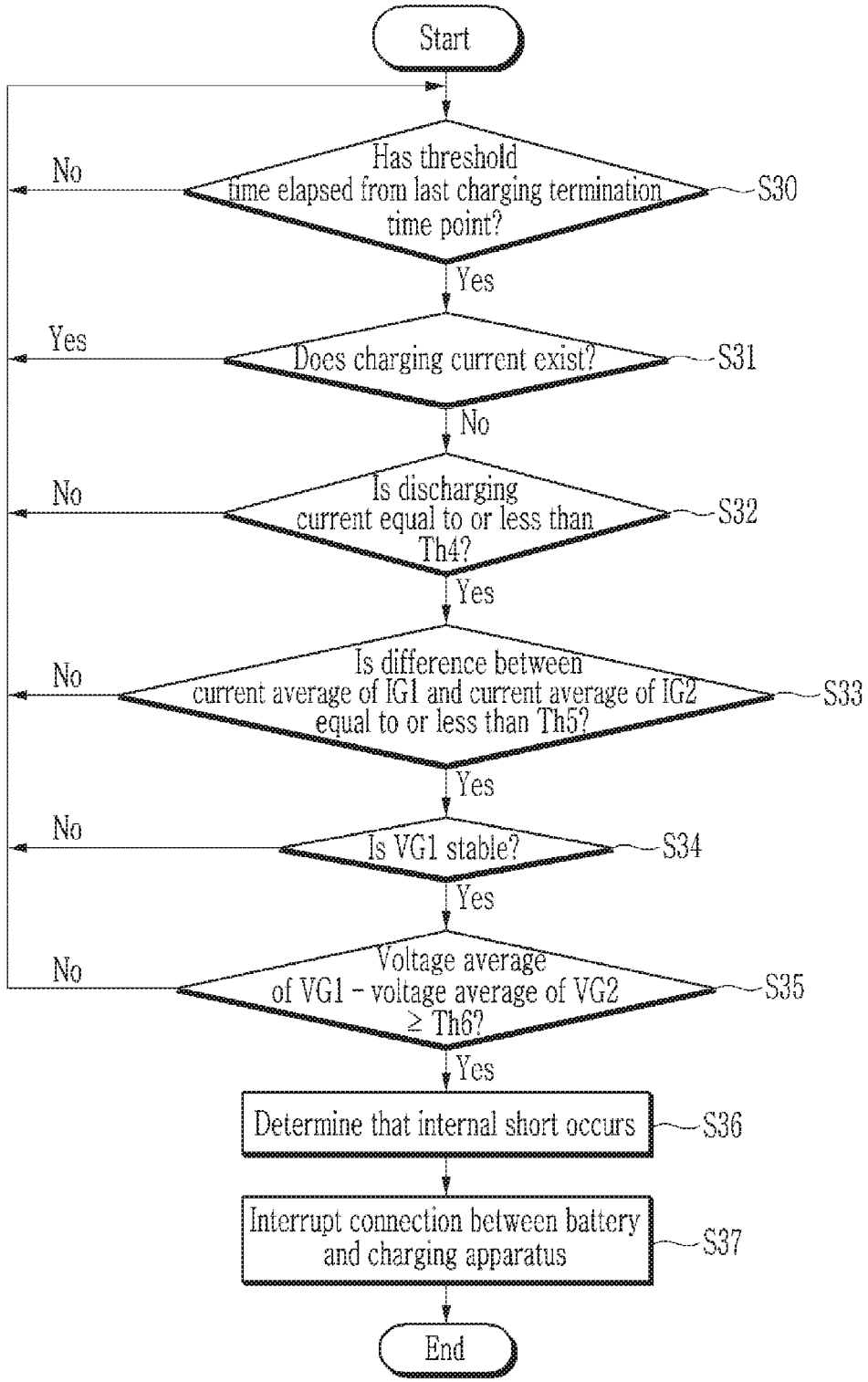

BATTERY CONTROL APPARATUS AND METHOD FOR DETECTING INTERNAL SHORT OF BATTERY

CROSS-REFERENCE TO RELATED APPLICATION

This application claims priority to and the benefit of Korean Patent Application No. 10-2018-0085589 and 10-2019-0083344 filed in the Korean Intellectual Property Office on Jul. 23, 2018 and Jul. 10, 2019, respectively, the entire contents of each of which are incorporated herein by reference.

BACKGROUND

1. Field

The present invention relates to a battery control apparatus and a method for detecting an internal short of a battery.

2. Description of the Related Art

As the electric and electronic technology is developed, use of portable electronic products, which are small and light, and have various functions, is sharply increasing. A battery is generally used as a power supply device for an operation of a portable electronic product, and a rechargeable battery, which is charged and is re-usable, is mainly used.

The rechargeable battery is a chargeable and dischargeable battery, unlike a primary battery that cannot be charged. The rechargeable battery is used in a portable small electronic device, such as a portable phone or a notebook computer, or is widely used as a power source for driving a motor of a power tool, a vehicle, and the like. An internal part of the rechargeable battery may be formed of a positive electrode, a negative electrode, a separation film, an electrolyte, and the like, and a case may be formed of a metal plate or a pouch.

A rechargeable battery having high energy density may cause a problem in safety, such as thermal runaway, and particularly, the case where the positive electrode and the negative electrode inside the rechargeable battery are short-circuited, so that the rechargeable battery is overheated is a representative example. The internal short is caused from a loss of a function of the separation film, and examples thereof include deformation by an external impact, metallic foreign substances included in a manufacturing process, and the forming of dendrite of lithium or copper by an electrochemical reaction.

In the related art, a technology of detecting a state of an internal short of a rechargeable battery in advance and preventing the internal short is developed. In the scheme in the related art, a check time of several tens of minute is required in the state where a voltage of the rechargeable battery is very stable. Accordingly, there is a disadvantage in that it is impossible to detect the internal short generated in the state where the rechargeable battery is continuously charged or discharged.

The above information disclosed in this Background section is only for enhancement of understanding of the background of the invention and therefore it may contain information that does not form the prior art that is already known in this country to a person of ordinary skill in the art.

SUMMARY

The present invention has been made in an effort to provide a battery control apparatus and a method for detecting an internal short of a battery, which rapidly detect an internal short of a battery.

The present invention has also been made in an effort to provide a battery control apparatus and a method for detecting an internal short of a battery which are capable of preventing thermal runway of a battery.

An exemplary embodiment of the present invention provides a method for detecting an internal short of a battery, which includes: measuring a voltage of a battery a plurality of times; and determining whether the internal short of the battery occurs based on a difference between a first voltage value of the battery during a first time period and a second voltage value of the battery during a second time period when the battery is in constant current charging, in which the second time period is a time period after the first time period.

The method may further include: measuring a current of the battery a plurality of times; and determining whether a current change width of the battery during the first time period and a current change width of the battery during the second time period are within a first range, and the determining of whether the internal short occurs may be performed when the current change width of the battery during the first time period and the current change width of the battery during the second time period are within the first range.

The method may further include determining whether a voltage change width of the battery during the first time period is within a second range, and the determining of whether the internal short occurs may be performed when the voltage change width of the battery during the first time period is within the second range.

In the method, the determining of whether the internal short occurs may include determining that the internal short occurs in the battery when a value acquired by subtracting the second voltage value from the first voltage value is equal to or more than a first threshold. In the method, the first voltage value may be an average of voltage values of the battery measured during the first time period and the second voltage value may be an average of the voltage values of the battery measured during the second time period or the first voltage value may be an instantaneous voltage value of the battery measured during the first time period and the second voltage value may be the instantaneous voltage value of the battery measured during the second time period, and the first threshold may be a real number larger than 0.

Another exemplary embodiment of the present invention provides a method for detecting an internal short of a battery, which includes: measuring a current of the battery a plurality of times; and determining whether the internal short of the battery occurs based on a difference between a first current value during a first time period of the battery and a second current value during a second time period when the battery is in constant voltage charging, in which the second time period is a time period after the first time period.

The method may further include: measuring a voltage of a battery a plurality of times; determining whether a current change width of the battery during the first time period is within a third range; and determining whether a voltage change width of the battery during the first time period is within a fourth range, and the determining of whether the internal short occurs may be performed when the current change width of the battery during the first time period is within the third range and when the voltage change width of the battery during the first time period are within the fourth range.

The method may further include determining whether a difference between a first voltage value of the battery during the first time period and a second voltage value of the battery during the second time period is equal to or less than a second threshold, and the determining of whether the internal short occurs may be performed when the difference between the first voltage value and the second voltage value is equal to or less than the second threshold.

In the method, the determining of whether the internal short occurs may include determining that the internal short occurs in the battery when a value acquired by subtracting the first current value from the second current value is equal to or more than a third threshold. Further, in the method, the first current value may be an average of current values of the battery measured during the first time period and the second current value may be an average of the current values of the battery measured during the second time period or the first current value may be an instantaneous current value of the battery measured during the first time period and the second current value may be the instantaneous current value of the battery measured during the second time period, and the third threshold may be a real number larger than 0.

Yet another exemplary embodiment of the present invention provides a method for detecting an internal short of a battery, which includes: measuring a voltage and a current of the battery a plurality of times; determining whether the battery is being charged based on the voltage and the current of the battery; and determining whether the internal short of the battery occurs based on a difference between a first voltage value of the battery during a first time period of the battery and a second voltage value of the battery during a second time period after a threshold time elapsed from a charging termination time point of the battery, and the second time period is a time period after the first time period.

The method may further include: determining whether there is a charging current supplied to the battery during the first time period and the second time period; and determining whether a discharging current of the battery is equal to or less than a fourth threshold during the first time period and the second time period, and the determining of whether the internal short occurs may be performed when there is no charging current supplied to the battery during the first time period and the second time period and the discharging current of the battery is equal to or less than the fourth threshold during the first time period and the second time period.

The method may further include determining whether a difference between a first current value of the battery during the first time period and a second current value of the battery during the second time period is equal to or less than a fifth threshold, and the determining of whether the internal short occurs may be performed when the difference between the first current value and the second current value is equal to or less than the fifth threshold. In the method, the first current value may be an average of current values of the battery measured during the first time period and the second current value may be an average of the current values of the battery measured during the second time period or the first current value may be an instantaneous current value of the battery measured during the first time period and the second current value may be the instantaneous current value of the battery measured during the second time period.

The method may further include determining whether a voltage change width of the battery during the first time period is within a fifth range, and the determining of whether the internal short occurs may be performed when the voltage change width of the battery during the first time period is within the fifth range.

In the method, the determining of whether the internal short occurs may include determining that the internal short occurs in the battery when a value acquired by subtracting the second voltage value from the first voltage value is equal to or more than a sixth threshold. In the method, the first voltage value may be an average of voltage values of the battery measured during the first time period and the second voltage value may be an average of the voltage values of the battery measured during the second time period or the first voltage value may be an instantaneous voltage value of the battery measured during the first time period and the second voltage value may be the instantaneous voltage value of the battery measured during the second time period, and the sixth threshold may be a real number larger than 0.

An exemplary embodiment of the present invention provides an apparatus for controlling a battery, which includes: a measuring unit configured to measure a voltage and a current of the battery a plurality of times; and a detecting unit configured to determine that the internal short of the battery occurs based on a difference between a first voltage value of the battery during a first time period and a second voltage value of the battery during a second time period when the battery is in constant current charging, in which the second time period is a time period after the first time period.

In the apparatus, the detecting unit may detect the internal short of the battery using the first voltage value and the second voltage value when a current change width of the battery during the first time period and the current change width of the battery during the second time period are within a first range and a voltage change width of the battery during the first time period is within a second range.

In the apparatus, the first voltage value may be an average of voltage values of the battery measured during the first time period and the second voltage value may be an average of the voltage values of the battery measured during the second time period or the first voltage value may be an instantaneous voltage value of the battery measured during the first time period and the second voltage value may be the instantaneous voltage value of the battery measured during the second time period.

In the apparatus, the detecting unit may determine that the internal short occurs in the battery when a value acquired by subtracting the second voltage value from the first voltage value is equal to or more than a first threshold. The first threshold may be a real number larger than 0.

Another exemplary embodiment of the present invention provides an apparatus for controlling a battery, which includes: a measuring unit configured to measure a voltage and a current of the battery a plurality of times; and a detecting unit configured to determine whether the internal short of the battery occurs based on a difference between a first current value during a first time period of the battery and a second current value during a second time period when the battery is in constant voltage charging, in which the second time period is a time period after the first time period.

In the apparatus, the detecting unit may detect the internal short of the battery using the first current value and the second current value when a current change width of the battery during the first time period is within a third range and a voltage change width of the battery during the first time period is within a fourth range.

In the apparatus, the detecting unit may detect the internal short of the battery using the first current value and the second current value when a difference between a first voltage value of the battery during the first time period and a second voltage value during the second time period is equal to or less than a second threshold.

In the apparatus, the detecting unit may determine that the internal short occurs in the battery when a value acquired by subtracting the first current value from the second current value is equal to or more than a third threshold. In the apparatus, the first current value may be an average of current values of the battery measured during the first time period and the second current value may be an average of the current values measured during the second time period or the first current value may be an instantaneous current value of the battery measured during the first time period and the second current value may be the instantaneous current value of the battery measured during the second time period. The third threshold may be a real number larger than 0.

Yet another exemplary embodiment of the present invention provides an apparatus for controlling a battery, which includes: a measuring unit configured to measure a voltage and a current of the battery a plurality of times; and a detecting unit configured to determine whether the internal short of the battery occurs based on a difference between a first voltage value of the battery during a first time period and a second voltage value of the battery during a second time period after a threshold time elapsed from a charging termination time point of the battery, in which the second time period is a time period after the first time period.

In the apparatus, the detecting unit may detect the internal short of the battery using the first voltage value and the second voltage when there is no charging current supplied to the battery during the first time period and the second time period and a discharging current of the battery is equal to or less than a fourth threshold during the first time period and the second time period.

In the apparatus, the detecting unit may detect the internal short of the battery using the first voltage value and the second voltage value when a difference between a first current value during the first time period and a second current value during the second time period is equal to or less than a fifth threshold. In the apparatus, the first current value may be an average of current values of the battery measured during the first time period and the second current value may be an average of the current values of the battery measured during the second time period or the first current value may be an instantaneous current value of the battery measured during the first time period and the second current value may be the instantaneous current value of the battery measured during the second time period.

In the apparatus, the detecting unit may detect the internal short of the battery using the first voltage value and the second voltage value when a voltage change width of the battery during the first time period is within a fifth range.

In the apparatus, the detecting unit may determine that the internal short occurs in the battery when a value acquired by subtracting the second voltage value from the first voltage value is equal to or more than a sixth threshold. In the apparatus, the first voltage value may be an average of voltage values of the battery measured during the first time period and the second voltage value may be an average of the voltage values of the battery measured during the second time period or the first voltage value may be an instantaneous voltage value of the battery measured during the first time period and the second voltage value may be the instantaneous voltage value of the battery measured during the second time period. The sixth threshold may be a real number larger than 0.

According to an exemplary embodiment of the present invention, there is an effect in that it is possible to rapidly detect an internal short of a battery.

Further, according to an exemplary embodiment of the present invention, there is an effect in that it is possible to prevent thermal runaway of a battery.

BRIEF DESCRIPTION OF THE DRAWINGS

FIG. 6 is a flowchart illustrating a method for detecting an internal short according to a second exemplary embodiment of the present invention.

FIG. 7 is a flowchart illustrating a method for detecting an internal short according to a third exemplary embodiment of the present invention.

DETAILED DESCRIPTION

Hereinafter, a battery control apparatus according to an exemplary embodiment of the present invention will be described in detail with reference to FIGS. 1 to 3.

Figure 1:
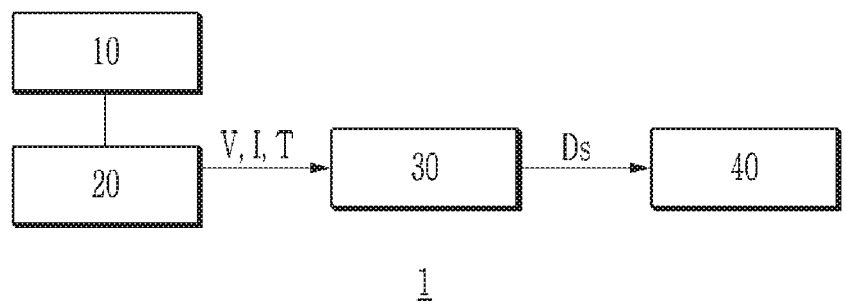
FIG. 1 is a block diagram illustrating a configuration of a battery control apparatus according to an exemplary embodiment of the present invention.
Figure 2:
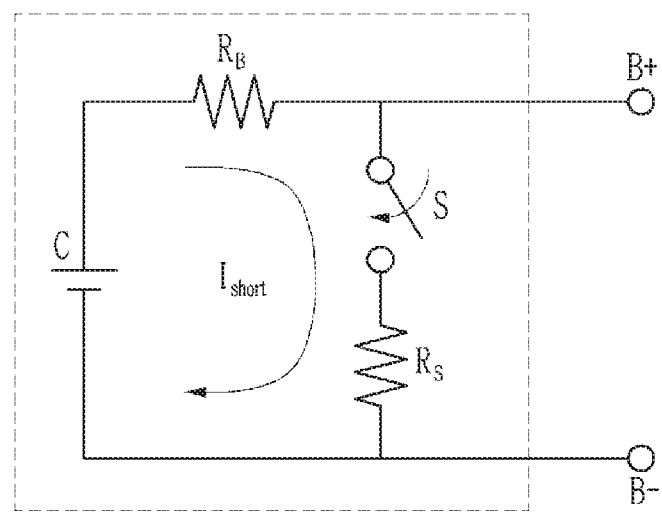
FIG. 2 is an equivalent circuit of a battery according to the exemplary embodiment of the present invention.

FIG. 1 is a block diagram illustrating a configuration of a battery control apparatus according to an exemplary embodiment of the present invention and FIG. 2 is an equivalent circuit of a battery according to the exemplary embodiment of the present invention.

Referring to FIG. 1, a battery control apparatus 1 according to an exemplary embodiment of the present invention may include a battery 10, a measuring unit 20, a detecting unit 30, and a control unit 40 and may prevent thermal runaway of the battery by sensing the internal short of the battery 10.

The battery 10 as a secondary battery which is chargeable and dischargeable may be referred to as a cell.

Referring to FIG. 2, the battery 10 may include two terminals B+ and B− and may be charged by an external charging device (not illustrated) or discharged by an external load (not illustrated) through the two terminals B+ and B−. For convenience of the description, it is described that the charging device is provided outside the battery control apparatus 1, but the exemplary embodiment of the present invention is not limited thereto.

As illustrated in FIG. 2, the battery 10 may include an internal resistor $R_B$, and the internal resistor $R_B$ may have a resistance value of several mΩ to several hundreds of mΩ. When an internal short is generated in the battery 10, the same effect as an effect in that a switch S inside the battery 10 is electrically connected is generated. When the switch S is electrically connected, a short current $I_{short}$ flows in a short resistor $R_s$, so that the battery 10 is discharged. In this case, the short resistor may have a resistance value of a broad range of several mΩ to several kΩ.

The battery 10 may be charged by one or more charging methods among constant current (CC) charging, in which the battery is charged with a constant current from an initial stage to a completion stage of the charging, constant voltage (CV) charging, in which the battery is charged with a constant voltage from an initial stage to a completion state of the charging, and CC-CV charging, in which the battery is charged with a constant current at an initial stage of the charging and is charged with a constant voltage at a completion stage of the charging.

The measuring unit 20 continuously measures a charging start time point, a charging termination time point, a voltage V, a current I, and a temperature T of the battery 10 and transfers the measured voltage value, a measured current value, a measured temperature value, a measured charging start time point, a measured charging termination time point, etc., to the detecting unit 30. The measuring unit 20 may discretely perform the measurement. A predetermined time period may exist between two measurement time points and a length of the time period may be changed. The measuring unit 20 may detect at least one of the voltage, current, and the temperature at one measurement time point.

Hereinafter, a voltage and a current according to a state of the battery 10 measured by the measuring unit 20 will be described with reference to FIGS. 3A to 3C.

Figure 3A:
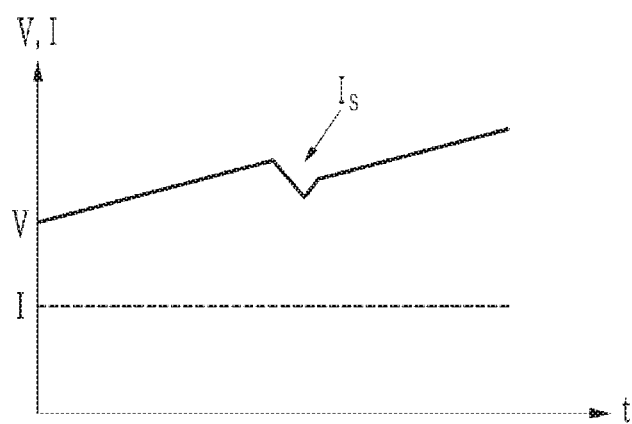
FIG. 3A is a graph illustrating a voltage and a current during CC charging of the battery according to the exemplary embodiment of the present invention.

Referring to FIG. 3A, when the battery 10 is charged by the CC charging, the charging current I supplied to the battery 10 has a predetermined value, and the voltage V of the battery 10 is gradually increased. During the CC charging, when the internal short $I_s$ is generated in the battery 10, there occurs a phenomenon in which the voltage V of the battery 10 is sharply decreased and then is increased again. Referring to FIG. 2, the phenomenon occurs because equivalent resistance of the battery 10, that is, combined resistance of the internal resistor $R_B$ and the short resistor $R_S$ of the battery 10, is momentarily changed due to the internal short of the battery 10.

Figure 3B:
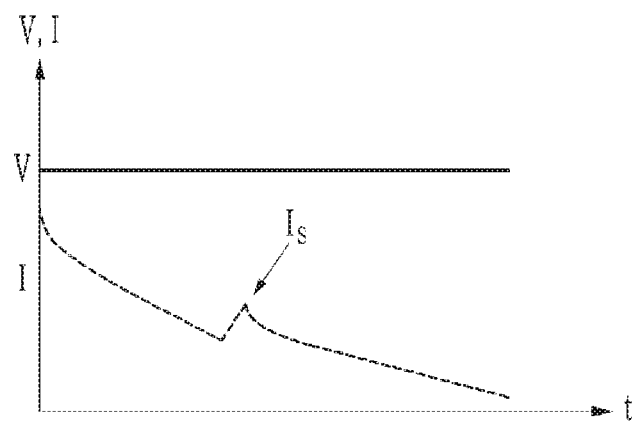
FIG. 3B is a graph illustrating a voltage and a current during CV charging of the battery according to the exemplary embodiment of the present invention.

Further, referring to FIG. 3B, when the battery 10 is charged by the CV charging, the voltage V of the battery 10, i.e., the charging voltage has a predetermined value and the charging current I is gradually decreased. During the CV charging, when the internal short $I_s$ is generated in the battery 10, there occurs a phenomenon in which the charging current I of the battery 10 is sharply increased and then is decreased again. Referring to FIG. 2, the phenomenon occurs because equivalent resistance of the battery 10, that is, combined resistance of the internal resistor $R_B$ and the short resistor $R_S$ of the battery 10, is momentarily changed due to the internal short of the battery 10.

Figure 3C:
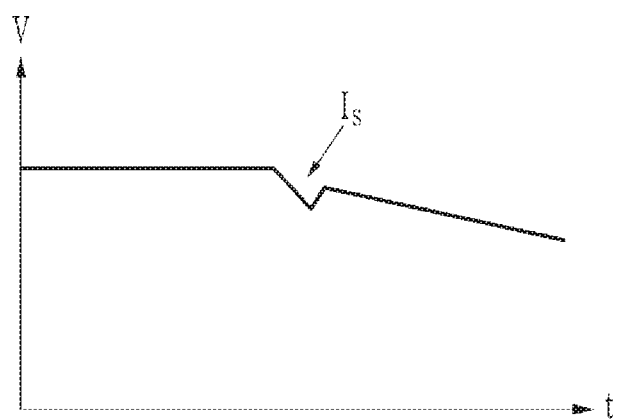
FIG. 3C is a graph illustrating a voltage in an open voltage state of the battery according to the exemplary embodiment of the present invention.

Further, referring to FIG. 3C, when the voltage of the battery 10 is in an open voltage state, for example, in the case where the battery 10 is not connected to a load or is connected to a very low load, the voltage V of the battery 10 is uniformly maintained for a predetermined time and then is gradually decreased. In this case, when the internal short $I_s$ is generated in the battery 10, there occurs a phenomenon in which the voltage V of the battery 10 is sharply decreased and then is gradually decreased. Referring to FIG. 2, the phenomenon occurs because equivalent resistance of the battery 10, that is, combined resistance of the internal resistor $R_B$ and the short resistor $R_S$ of the battery 10, is momentarily changed due to the internal short of the battery 10.

The detecting unit 30 receives a voltage value, a current value, a temperature value, etc., of the battery 10 from the measuring unit 20 and stores the received voltage value, current value, temperature value, etc., in a memory (not illustrated).

Referring to FIGS. 3A to 3C, a change aspect of the voltage or current of the battery 10 depending on the internal short varies depending on whether the battery 10 is being charged and a charging scheme (CC charging and CV charging). Therefore, the battery control apparatus 1 checks whether the current battery 10 is being charged and the charging scheme when the battery is being charged in order to detect the internal short. That is, the detecting unit 30 determines whether the current battery 10 is any one of the CC charging state, the CV charging state, and the open voltage state (no load or low load state) by using the measured voltage value and current value of the battery 10.

Referring to FIG. 3A, when the internal short $I_s$ is generated in the battery 10 during an period of the CC charging, there occurs a phenomenon in which the voltage V of the battery 10 is instantaneously decreased. Accordingly, the detecting unit 30 detects the occurrence of the internal short of the battery 10 by monitoring the change in voltage V of the battery 10 when the battery 10 is in the CC charging.

As an example, the detecting unit 30 may determine, from voltage values measured by the measuring unit 20 during the constant current charging of the battery 10, a first voltage group and a second voltage group constituted by voltage values measured during different time periods and determine that the internal short occurs in the battery 10 when a difference between an average of the voltage values included in the first voltage group and the average of the voltage values included in the second voltage group is equal to or more than a threshold. Here, each of the first voltage group and the second voltage group may include a plurality of voltage values measured for a predetermined period and the voltage values included in the first voltage group may be voltages measured before the voltage values included in the second voltage group. A method for determining the first and second voltage groups will be described in detail with reference to FIG. 4 to be described below.

As another example, the detecting unit 30 may select, from voltage values measured by the measuring unit 20 during the constant current (CC) charging of the battery 10, a first voltage value and a second voltage value during different time periods, respectively and determine that the internal short occurs in the battery 10 when a difference between the first voltage value and the second voltage value is equal to or more than a threshold. Here, the first and second voltage values are instantaneous voltage values and the first voltage value may be a voltage value measured before the second voltage value.

Referring to FIG. 3B, when the internal short $I_s$ is generated in the battery 10 during an period of the CV charging, the charging current I of the battery 10 is instantaneously sharply increased. Accordingly, the detecting unit 30 detects the occurrence of the internal short of the battery 10 by monitoring the change in current of the battery 10 when the battery 10 is in the CV charging.

As an example, the detecting unit 30 may determine, from current values measured by the measuring unit 20 during the constant voltage (CV) charging of the battery 10, a first current group and a second current group constituted by current values measured during different time periods and determine that the internal short occurs in the battery 10 when a difference between the average of the current values included in the first current group and the average of the current values included in the second current group is equal to or more than a threshold. Here, each of the first current group and the second current group may include a plurality of current values measured for a predetermined period and the current values included in the first current group may be current values measured before the current values included in the second current group. A method for determining the first and second current groups will be described in detail with reference to FIG. 4 to be described below.

As another example, the detecting unit 30 may select, from current values measured by the measuring unit 20 during the constant voltage (CV) charging of the battery 10, a first current value and a second current value during different time periods, respectively and determine that the internal short occurs in the battery 10 when a difference between the first current value and the second current value is equal to or more than a threshold. Here, the first and second current values are instantaneous current values and the first current value may be a current value measured before the second current value.

Referring to FIG. 3C, when charging of the battery 10 is completed and the battery 10 is in the open voltage state (for example, a state where no load is connected to the battery 10 or a state where a very low load is connected), the voltage V of the battery 10 is kept constant for a predetermined time and then gradually decreased and when the internal short occurs in the battery 10, the voltage of the battery 10 is sharply decreased. Accordingly, the detecting unit 30 detects the occurrence of the internal short of the battery 10 by monitoring the change in voltage V of the battery 10 when the charging of the battery 10 is terminated and the battery 10 is in the current open voltage state.

As an example, the detecting unit 30 may determine, from voltage values measured by the measuring unit 20 during the open voltage state of the battery 10, a first voltage group and a second voltage group constituted by voltage values measured during different time periods and determine that the internal short occurs in the battery 10 when a difference between an average of the voltage values included in the first voltage group and the average of the voltage values included in the second voltage group is equal to or more than a threshold. Here, each of the first voltage group and the second voltage group may include a plurality of voltage values measured for a predetermined period and the voltage values included in the first voltage group may be voltages measured before the voltage values included in the second voltage group. A method for determining the first and second voltage groups will be described in detail with reference to FIG. 4 to be described below.

As another example, the detecting unit 30 may select, from voltage values measured by the measuring unit 20 during the open voltage state of the battery 10, a first voltage value and a second voltage value during different time periods, respectively and determine that the internal short occurs in the battery 10 when a difference between the first voltage value and the second voltage value is equal to or more than a threshold. Here, the first and second voltage values are instantaneous voltage values and the first voltage value may be a voltage value measured before the second voltage value.

Meanwhile, when the battery 10 is in the open voltage state, voltage values used for determining the internal short may be voltage values measured after a threshold time elapsed from a charging termination time point of the battery 10. Here, the threshold time may mean a time until the internal short may be determined after charging termination and when the internal short is determined by using voltage values measured before the threshold time, determination accuracy may be degraded.

When the detecting unit 30 detects the internal short of the battery 10 by using the aforementioned schemes, the detecting unit 30 generates a detection signal Ds including the state of the battery 10 and whether the internal short Is occurs. A specific process of detecting the internal short of the battery 10 by the detecting unit 30 will be described in detail with reference to FIGS. 5 to 7 to be described below.

The control unit 40 may control connection or disconnection of an external charging apparatus (not illustrated) or a load (not illustrated) connected to the battery 10 based on the detection signal Ds generated by the detecting unit 30. For example, the control unit 40 may interrupt the connection of the external charging apparatus (not illustrated) or the load (not illustrated) connected to the battery 10 when the detection signal Ds indicating the occurrence of the internal short of the battery 10 is generated by the detecting unit 30.

Accordingly, the battery control apparatus 1 according to the exemplary embodiment of the present invention may detect the internal short of the battery 10 and control the connection between the battery 10 and a charging apparatus (or load) according to a detection result of the internal short, thereby preventing thermal runaway of the battery 10 due to the internal short.

When the detection signal Ds indicating the internal short of the battery 10 is generated by the detecting unit 30, the control unit 40 may transfer a notification signal for notifying the occurrence of the internal short of the battery 10 to a higher system.

Figure 4:
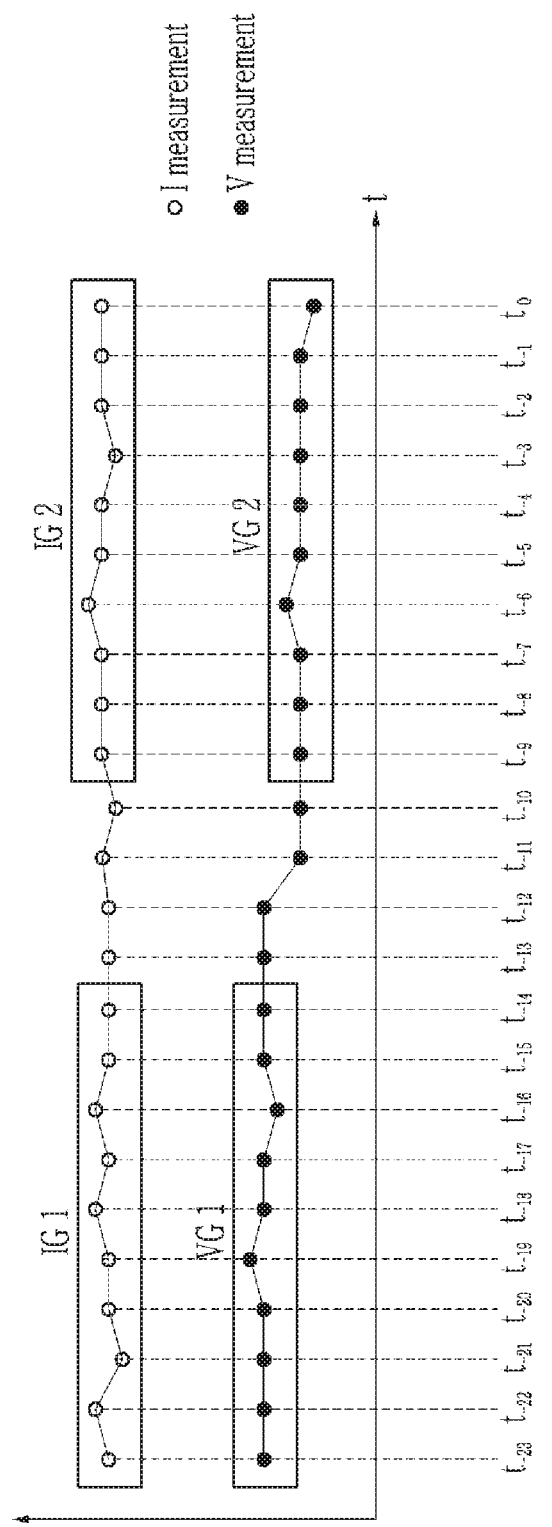
FIG. 4 illustrates one example of setting a voltage group and a current group in a battery control apparatus according to an exemplary embodiment of the present invention.

FIG. 4 illustrates one example of determining a voltage group and a current group used for detecting an internal short by a battery control apparatus according to an exemplary embodiment of the present invention.

Referring to FIG. 4, the detecting unit 30 receives voltage and current values measured at a plurality of measurement points $t_{-23}$ to $t_0$ from the measuring unit 20 and sets voltage groups VG1 and VG2 and current groups IG1 and IG2 to include some of the voltage values and the current values. In FIG. 4, $t_0$ represents a current measurement time point, i.e., a most recent measurement time point and $t_{-23}$ represents a measurement time point measured earliest. Specifically, as illustrated in FIG. 4, the detecting unit 30 determines a first current group IG1 including current values measured at a plurality of measurement time points $t_{-23}$ to $t_{-14}$ and a second current group IG2 including current values measured at a plurality of measurement time points $t_{-9}$ to $t_0$ among the current values measured at the plurality of measurement time points $t_{-23}$ to $t_0$ by the measuring unit 20. Further, the detecting unit 30 determines a first voltage group VG1 including voltage values measured at the plurality of measurement time points $t_{-23}$ to $t_{-14}$ and a second voltage group VG2 including voltage values measured at the plurality of measurement time points $t_{-9}$ to $t_0$ among the voltage values measured at the plurality of measurement time points $t_{-23}$ to $t_0$ by the measuring unit 20. For convenience of description, it is described that the number of measurement time points corresponding to each of the voltage groups VG1 and VG2 and each of the current groups IG1 and IG2 is 10, but the exemplary embodiment of the present invention is not limited thereto. Magnitudes of each of the voltage groups VG1 and VG2 and each of the current groups IG1 and IG2, that is, the numbers of voltage values and current values included in each of the voltage groups VG1 and VG2 and each of the current groups IG1 and IG2 may be proportional to sizes of memories allocated to each of the voltage groups VG1 and VG2 and each of the current groups IG1 and IG2.

Referring to FIGS. 3A to 3C, when the internal short occurs in the battery 10, the current (or voltage) of the battery 10 is unstable during a predetermined period. Accordingly, when the internal short occurs, in order to make a situation in which currents (or voltages) of two time periods in which a currents is relatively stable are compared, except a period in which a current (or voltage) is instable due to the occurrence of the internal short, as illustrated in FIG. 4, the detecting unit 30 may determine the current groups IG1 and IG2 (or voltage groups VG1 and VG2) so that a predetermined interval including at least one measurement time point $t_{-13}$ to $t_{-10}$ exists between the time period $t_{-23}$ to $t_{-14}$ corresponding to the first current group IG1 and the time period $t_{-9}$ to $t_0$ corresponding to the second current group IG2 (or between the time period $t_{-23}$ to $t_{-14}$ corresponding to the first voltage group VG1 and the time period $t_{-9}$ to $t_0$ corresponding to the second voltage group VG2). However, the exemplary embodiment of the present invention is not limited thereto, and there may be no time gap between the time periods corresponding to the current groups IG1 and IG2 (or the voltage groups VG1 and VG2).

That is, the first voltage group VG1 may include voltage values measured a plurality of times during the first time period and the second voltage group VG2 may include voltage values measured a plurality of times during the second time period. Similarly, the first current group IG1 includes current values measured a plurality of times during the first time period and the second current group IG2 includes current values measured a plurality of times during the second time period. The first time period and the second time period may partially overlap with each other, the time period may exist between two time periods or when the first time period is terminated, the second time period may be started. Further, the first time period may be earlier in time than the second time period. The lengths of the first and second time periods may be equal to or different from each other.

In FIG. 4, it is illustrated that a current measurement time point and a voltage measurement time point of the battery 10 are equal to each other, but the current measurement time point and the voltage measurement time point of the battery 10 may be different from each other. Further, in FIG. 4, it is illustrated that the number of voltage values included in each of the voltage groups VG1 and VG2 and the number of current values included in each of the current groups IG1 and IG2 are equal to each other as an example, but the number of voltage values included in each of the voltage groups VG1 and VG2 and the number of current values included in each of the current groups IG1 and IG2 may be different from each other.

In FIG. 4, the current values included in the first and second current groups IG1 and IG2 and the voltage values included in the first and second voltage groups VG1 and VG2 may be differently selected with time. That is, the detecting unit 30 may shift the time periods corresponding to the first and second current groups IG1 and IG2, respectively and the time periods corresponding to the first and second voltage groups VG1 and VG2, respectively whenever a new current value or a new voltage value is measured so that the second current group IG2 and the second voltage group VG2 include the current value and the voltage value (a current value and a voltage value measured most recently) at a current time point, respectively. Shifting the time period shifts at least one of the measurement time points corresponding to each of the current groups IG1 and IG2 or each of the voltage group VG1 and VG2, and as a result, the current values included in each of the current groups IG1 and IG2 or the voltage values included in each of the voltage groups VG1 and VG2 are changed. For example, at time $t_{-1}$, the time period corresponding to the second voltage group VG2 is $t_{-10}$ to $t_{-1}$, and at time $t_0$, the time period corresponding to the second voltage group VG2 is $t_{-9}$ to $t_0$.

In the battery control apparatus 1 described above, the measuring unit 20, the detecting unit 30, or the control unit 40 may be performed by one or more central processing units (CPUs) or a processor implemented by other chipsets, microprocessors, etc.

Hereinafter, a method for detecting the internal short $I_S$ of the battery 10 by the battery control apparatus 1 will be described with reference to FIGS. 5 to 7. In the following description, the first and second current groups IG1 and IG2 and the first and second voltage groups VG1 and VG2 correspond to the first and second current groups IG1 and IG2 and the first and second voltage groups VG1 and VG2 described with reference to FIG. 4.

Figure 5:
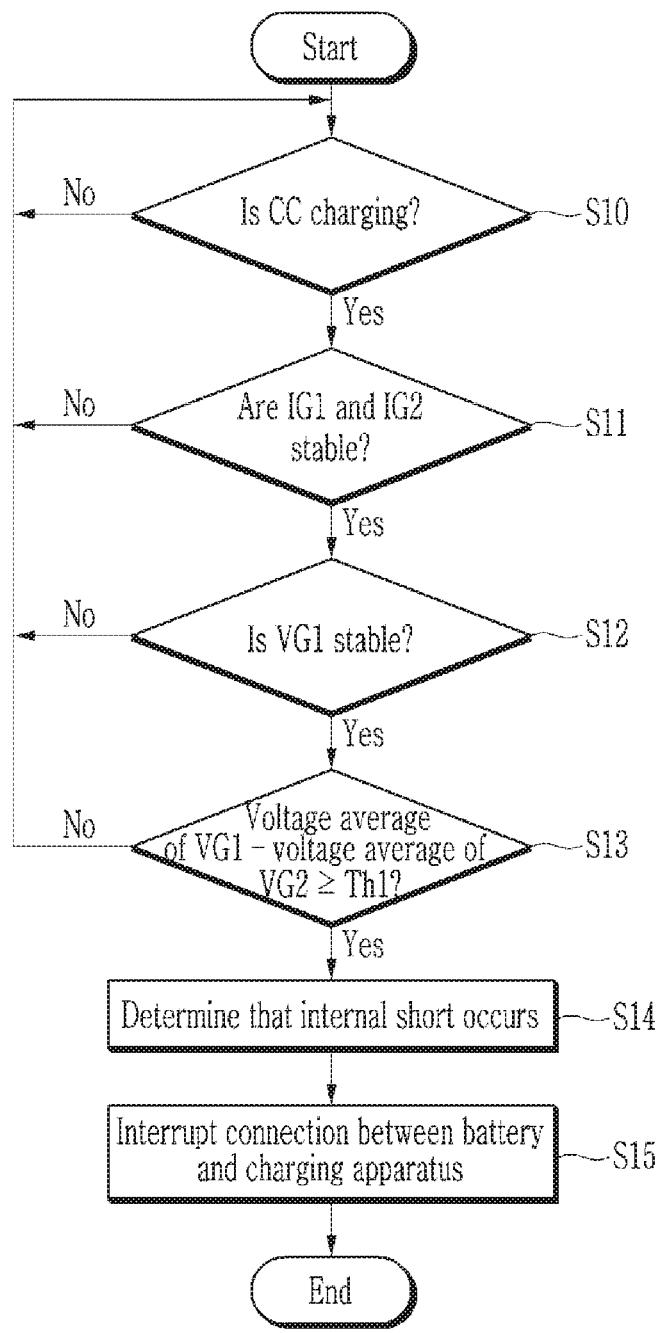
FIG. 5 is a flowchart illustrating a method for detecting an internal short according to a first exemplary embodiment of the present invention.

FIG. 5 is a flowchart illustrating a method for detecting an internal short according to a first exemplary embodiment of the present invention. The method for detecting the internal short in FIG. 5 may be performed by the battery control apparatus 1 described with reference to FIGS. 1 and 2.

Referring to FIG. 5, in step S10, the detecting unit 30 determines whether the state of the battery 10 is the constant current (CC) charging by using the voltage values and the current values of the battery 10 measured by the measuring unit 20. Specifically, as illustrated in FIG. 3A, when it is measured that the charging current I of the battery 10 holds a predetermined value and the voltage V of the battery 10 is gradually increased, the detecting unit 30 determines that the state of the battery 10 is the constant current (CC) charging.

In step S11, when it is determined that the battery 10 is in the constant current (CC) charging, the detecting unit 30 determines that the first current group IG1 and the second current group IG2 are stable. For example, the detecting unit 30 determines that the first current group IG1 is stable when a change width (a difference between a maximum value and a minimum value of the current values included in the first current group IG1) of the current values included in the first current group IG1 is within a predetermined first range and determines that the first current group IG1 and the second current group IG2 are stable when a change width (a difference between the maximum value and the minimum value of the current values included in the second current group IG2) of the current values included in the second current group IG2 is within a predetermined first range.

In step S12, when it is determined that the first current group IG1 and the second current group IG2 are stable, the detecting unit 30 determines that the first voltage group VG1 is stable. For example, the detecting unit 30 determines that the first voltage group VG1 is stable when the change width (the difference between the maximum value and the minimum value of the voltage values included in the first voltage group VG1) of the voltage values included in the first voltage group VG1 is within a predetermined second range.

In step S13, when it is determined that the first voltage group VG1 is stable, the detecting unit 30 determines whether a difference between a voltage average of the first voltage group VG1 and a voltage average of the second voltage group VG2, that is, a value acquired by subtracting an average of the voltage values included in the second voltage group VG2 from an average of the voltage values included in the first voltage group VG1 is equal to or more than a first threshold Th1.

In step S14, when the difference between the voltage average of the second voltage group VG2 and the voltage average of the first voltage group VG1 is equal to or more than the first threshold Th1, the detecting unit 30 determines that the internal short occurs in the battery 10. Further, in step S15, the thermal runaway of the battery 10 is prevented by interrupting the connection between the battery 10 and the charging apparatus (not illustrated).

A situation in which the current or voltage of the battery 10 is shaken due to factors (the apparatus is used during charging, etc.) other than the internal short while the battery 10 is in the constant current (CC) charging may occur and when the internal short is detected in such a situation, a detection error may occur. Accordingly, the detecting unit 30 confirms that the battery 10 is in the stable constant current (CC) charging state and then performs steps S11 and S12 described above in order to detect the internal short based on a voltage change.

In step S13, the first threshold Th1 may be a real number larger than 0. Referring to FIG. 3A, when the internal short occurs, the voltage of the battery 10 is instantaneously decreased, and as a result, even though the voltage of the battery 10 is then increased again, a state in which the voltage of the battery 10 is lower than the voltage before the internal short occurs is maintained during a predetermined period. That is, when the internal short occurs, the voltage average of the second voltage group VG2 measured after the occurrence of the internal short appears lower than the voltage average of the first voltage group VG1 measured before the internal short occurs, and as a result, a value acquired by subtracting the average of the voltage values included in the second voltage group VG2 from the average of the voltage values included in the first voltage group VG1 may be a real number larger than 0.

Meanwhile, in FIG. 5, it is illustrated that the voltage averages of the first voltage group and the second voltage group corresponding to different time periods are compared with each other in order to detect the internal short of the battery 10 during the constant current (CC) charging as an example, but the exemplary embodiment is not limited thereto. For example, the detecting unit 30 compares the first voltage value and the second voltage value measured during different time periods during the constant current (CC) charging with each other to detect the internal short of the battery 10. Here, the first and second voltage values are instantaneous voltage values, the first voltage value is one of the voltage values included in the first voltage group VG1, and the second voltage value is one of the voltage values included in the second voltage group VG2 and the detecting unit 30 may determine that the internal short occurs when a value acquired by subtracting the second voltage value from the first voltage value is equal to or more than a first threshold Th1.

FIG. 6 is a flowchart illustrating a method for detecting an internal short according to a second exemplary embodiment of the present invention. The method for detecting the internal short in FIG. 6 may be performed by the battery control apparatus 1 described with reference to FIGS. 1 and 2.

Referring to FIG. 6, in step S20, the detecting unit 30 determines whether the state of the battery 10 is the constant voltage (CV) charging by using the voltage values and the current values of the battery 10 measured by the measuring unit 20. Specifically, as illustrated in FIG. 3B, when the charging voltage of the battery 10 is measured as a constant value V and it is measured that the charging current I is gradually decreased, the detecting unit 30 determines that the state of the battery 10 is the constant voltage (CV) charging.

In step S21, when the battery 10 is in the constant voltage (CV) charging, the detecting unit 30 determines whether the first current group IG1 is stable. For example, the detecting unit 30 determines whether the change width (the difference between the maximum value and the minimum value of the current values included in the first current group IG1) of the current values included in the first current group IG1 is within a predetermined third range and determines that the first current group IG1 is stable when the change width of the current values included in the first current group IG1 is within the predetermined third range.

In step S22, when the first current group IG1 is stable, the detecting unit 30 determines whether the first voltage group VG1 is stable. For example, the detecting unit 30 determines whether the change width (the difference between the maximum value and the minimum value of the voltage values included in the first voltage group VG1) of the voltage values included in the first voltage group VG1 is within a predetermined fourth range and determines that the first voltage group VG1 is stable when the change width of the voltage values included in the first voltage group VG1 is within the predetermined fourth range.

In step S23, when it is determined that the first voltage group VG1 is stable, the detecting unit 30 determines whether a difference between the voltage average of the second voltage group VG2 and the voltage average of the first voltage group VG1, that is, a value acquired by subtracting an average of the voltage values included in the first voltage group VG1 from the average of the voltage values included in the second voltage group VG2 is equal to or less than a second threshold Th2.

In step S24, when the difference between the voltage average of the second voltage group VG2 and the voltage average of the first voltage group VG1 is equal to or less than the second threshold Th2, the detecting unit 30 determines whether the difference between the current average of the second current group IG2 and the current average of the first current group IG1, that is, a value acquired by subtracting the average of the current values included in the first current group IG1 from the average of the current values included in the second current group IG2 is equal to or more than a third threshold Th3.

In step S25, when it is determined that the difference between the current average of the second current group IG2 and the current average of the first current group IG1 is equal to or more than the third threshold Th3 through step S24, the detecting unit 30 determines that the internal short occurs in the battery 10. Further, in step S26, the detecting unit 30 prevents the thermal runaway of the battery 10 by interrupting the connection between the battery 10 and the charging apparatus (not illustrated).

A situation in which the current or voltage of the battery 10 is shaken due to factors (the apparatus is used during charging, etc.) other than the internal short while the battery 10 is in the constant voltage (CV) charging may occur and when the internal short is detected in such a situation, the detection error may occur. Accordingly, the detecting unit 30 confirms that the battery 19 is in the stable constant voltage (CV) charging state and then performs steps S21 and S23 described above in order to detect the internal short based on a current change. In particular, step S23 is to distinguish a case where the charging current of the battery 10 fluctuates due to fluctuation in charging voltage other than the internal short during the constant voltage charging.

Meanwhile, in FIG. 23, it is illustrated as an example that the voltage averages of the first voltage group and the second voltage group corresponding to different time periods are compared with each other in order to detect the fluctuation in charging voltage, but the exemplary embodiment is not limited thereto. For example, the detecting unit 30 compares the first voltage value and the second voltage value measured during different time periods to check the fluctuation in charging voltage. Here, the first and second voltage values are the instantaneous voltage values, and the first voltage value is one of the voltage values included in the first voltage group VG1 and the second voltage value is one of the voltage values included in the second voltage group VG2. In this case, step S23 may be changed to a step of determining whether the value acquired by subtracting the first voltage value from the second voltage value is equal to or less than the second threshold Th2.

In step S24, the third threshold Th3 may be a real number larger than 0. Referring to FIG. 3B, when the internal short occurs, the charting current of the battery 10 is instantaneously increased, and as a result, even though the charging current of the battery 10 is then decreased again, a state in which the charging current of the battery 10 is higher than the charging current before the internal short occurs is maintained during a predetermined period. That is, when the internal short occurs, the current average of the second current group IG2 measured after the occurrence of the internal short appears higher than the current average of the first current group IG1 measured before the internal short occurs, and as a result, a value acquired by subtracting the average of the current values included in the first current group IG1 from the average of the current values included in the second current group IG2 may be a real number larger than 0.

In FIG. 6, it is illustrated that the current averages of the first current group and the second current group corresponding to different time periods are compared with each other in order to detect the internal short of the battery 10 during the constant voltage (CV) charging as an example, but the exemplary embodiment is not limited thereto. For example, the detecting unit 30 compares the first current value and the second current value measured during different time periods during the constant voltage (CV) charging with each other to detect the internal short of the battery 10. Here, the first and second current values are instantaneous current values, the first current value is one of the current values included in the first current group IG1, and the second current value is one of the current values included in the second current group IG2 and the detecting unit 30 may determine that the internal short occurs when a value acquired by subtracting the first current value from the second current value is equal to or more than the third threshold Th3.

FIG. 7 is a flowchart illustrating a method for detecting an internal short according to a third exemplary embodiment of the present invention. The method for detecting the internal short in FIG. 7 may be performed by the battery control apparatus 1 described with reference to FIGS. 1 and 2.

Referring to FIG. 7, in step S30, the detecting unit 30 determines whether a threshold time elapsed from a last charging termination time point. Specifically, the detecting unit 30 determines whether the threshold time elapsed from a time point when the constant voltage (CV) charging described with reference to FIG. 5 is terminated or a time point when the constant current (CC) charging described with reference to FIG. 6 is terminated.

In step S31, when the threshold time elapsed from the last charging termination time point, the detecting unit 30 determines whether there is the charging current supplied to the battery 10. Specifically, the detecting unit 30 determines whether there is the charging current by using the first current group IG1 and the second current group IG2 measured after the threshold time elapsed from the last charging termination time point of the battery 10.

In step S32, when it is determined that there is no charging current supplied to the battery 10 through step S31, the detecting unit 30 determines whether discharging current of the battery 10 is equal to or less than a fourth threshold Th4. Specifically the detecting unit 30 determines whether all of discharging current values included in the first current group IG1 and the second current group IG2 measured after the threshold time elapsed from the last charging termination time point of the battery 10 are equal to or less than the fourth threshold Th4. That is, the detecting unit 30 detects whether the battery 10 is in the current open voltage state, that is, whether the load is not connected to the battery 10 or a very low load is connected to the battery 10 through step S32.

In step S33, when it is determined that all discharging current values included in the first current group IG1 and the second current group IG2 are equal to or less than the fourth threshold through step S32, the detecting unit 30 determines whether an absolute value of the difference between the current average of the first current group IG1 and the current average of the second current group IG2, that is, the difference in current average between the first current group IG1 and the second current group IG2 is equal to or less than a fifth threshold Th5.

In step S34, when the difference between the current average of the first current group IG1 and the current average of the second current group IG2 is equal to or less than the fifth threshold Th5, the detecting unit 30 determines that the first voltage group VG1 is stable. For example, the detecting unit 30 determines that the first voltage group VG1 is stable when the change width (the difference between the maximum value and the minimum value) of the voltage values included in the first voltage group VG1 is within a predetermined fifth range. Further, for example, the detecting unit 30 determines that the first voltage group VG1 is stable when a standard deviation of the voltage values included in the first voltage group VG1 is within the predetermined fifth range.

In step S35, when it is determined that the first voltage group VG1 is stable in step S34, the detecting unit 30 determines whether the difference between the voltage average of the first voltage group VG1 and the voltage average of the second voltage group VG2, that is, the value acquired by subtracting the average of the voltage values included in the second voltage group VG2 from the average of the voltage values included in the first voltage group VG1 is equal to or more than a sixth threshold Th6.

In addition, in step S36, when the difference between the voltage average of the first voltage group VG1 and the voltage average of the second voltage group VG2 is equal to or more than the sixth threshold Th6, the detecting unit 30 determines that the internal short occurs in the battery 10. Further, in step S37, the thermal runaway of the battery 10 is prevented by interrupting the connection between the battery 10 and the charging apparatus (not illustrated).

A situation in which the current or voltage of the battery 10 is shaken due to factors (load connection, etc.) other than the internal short when the battery 10 is in the open voltage state may occur and when the internal short is detected in such a situation, the detection error may occur. Accordingly, the detecting unit 30 performs steps S33 and S34 described above in order to detect the internal short based on a voltage change while another factor which varies the current or voltage of the battery 10 is not generated. In particular, step S33 is to distinguish a case where the voltage of the battery 10 fluctuates due to the current change of the battery 10 other than the internal short in the open voltage state.

Meanwhile, in step S33, it is illustrated as an example that the current averages of the first current group and the second current group corresponding to different time periods are compared with each other in order to check the current fluctuation of the battery 10, but the exemplary embodiment is not limited thereto. For example, the detecting unit 30 compares the first current value and the second current value measured during different time periods to check the fluctuation in current. Here, the first and second current values are the instantaneous current values, and the first current value is one of the current values included in the first current group IG1 and the second current value is one of the current values included in the second current group IG2. In this case, step S33 may be changed to a step of determining whether the difference between the first current and the second current is equal to or less than the fifth threshold Th5.

Meanwhile, in FIG. 7, it is illustrated that the voltage averages of the first voltage group and the second voltage group corresponding to different time periods are compared with each other in order to detect the internal short of the battery 10 as an example, but the exemplary embodiment is not limited thereto. For example, the detecting unit 30 compares the first voltage value and the second voltage value measured during different time periods with each other to detect the internal short of the battery 10. Here, the first and second voltage values are instantaneous voltage values, the first voltage value is one of the voltage values included in the first voltage group VG1, and the second voltage value is one of the voltage values included in the second voltage group VG2 and the detecting unit 30 may determine that the internal short occurs when a value acquired by subtracting the second voltage value from the first voltage value is equal to or more than the sixth threshold Th6.

In FIGS. 5 to 7 described above, it is described as an example that the detecting unit 30 uses the difference between the maximum value and the minimum value among the current values included in the current group or the difference between the maximum value and the minimum value among the voltage values included in the voltage group in order to determine whether the current group or the voltage group is stable, but the exemplary embodiment is not limited thereto. For example, the detecting unit 30 may check the change width of each current group or each voltage group by using statistical parameters such as the standard deviation of the current values included in each current group or the voltage values included in each voltage group and determine whether each current group or each voltage group is stable based on the checked change width.

The thresholds described in this specification may also be all the real numbers larger than 0, but the exemplary embodiment is not limited thereto.

Meanwhile, in this specification, it is described as an example that the battery control apparatus 1 detects the internal short for one battery 10, but the exemplary embodiment is not limited thereto. For example, the battery control apparatus 1 is capable of detecting the internal short of each battery by applying the internal short detecting method even to a battery module in which a plurality of batteries is configured to be connected in series and/or in parallel. In this case, the voltage values included in each voltage group of FIG. 4 may correspond to the voltage of the corresponding battery and the voltage values included in each current group may correspond to charging current supplied to the battery module from the charging apparatus or discharging current supplied to the load from the battery module.

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

What is claimed is:

1. A method for detecting an internal short of a battery, the method comprising:
measuring a voltage of a battery a plurality of times; and
determining whether or not the internal short of the battery occurs based on a difference between a first voltage value of the battery during a first time period and a second voltage value of the battery during a second time period, when the battery is in constant current charging,
wherein the second time period is a time period after the first time period,
wherein the first time period and the second time period are determined so that a predetermined interval exists between the first time period and the second time period, and
wherein the voltage of the battery is measured at least once during the predetermined interval.

2. The method of claim 1, further comprising:
measuring a current of the battery a plurality of times; and
determining whether or not a current change width of the battery during the first time period and a current change width of the battery during the second time period are within a first range,
wherein the determining of whether or not the internal short occurs is performed when the current change width of the battery during the first time period and the current change width of the battery during the second time period are within the first range.

3. The method of claim 2, further comprising:
determining whether or not a voltage change width of the battery during the first time period is within a second range,
wherein the determining of whether or not the internal short occurs is performed when the voltage change width of the battery during the first time period is within the second range.

4. The method of claim 2, further comprising determining whether a state of the battery is the constant current (CC) charging by using voltage values and current values of the battery.

5. The method of claim 4, wherein the determining that the state of the battery is the constant current (CC) charging is based on determining that a charging current of the battery holds a predetermined value and the voltage of the battery is gradually increased.

6. The method of claim 1, wherein:
the determining of whether or not the internal short occurs includes
determining that the internal short occurs in the battery when a value acquired by subtracting the second voltage value from the first voltage value is equal to or more than a first threshold, and
the first threshold is a real number larger than 0.

7. The method of claim 1, further comprising interrupting a connection between the battery and a charging apparatus of the battery to prevent a thermal runaway of the battery based on determining that the internal short of the battery has occurred.

8. A method for detecting an internal short of a battery, the method comprising:
   measuring a current of the battery a plurality of times; and
   determining whether or not the internal short of the battery occurs based on a difference between a first current value during a first time period of the battery and a second current value during a second time period when the battery is in constant voltage charging,
      wherein the second time period is a time period after the first time period,
   wherein the first time period and the second time period are determined so that a predetermined interval exists between the first time period and the second time period, and
wherein the current of the battery is measured at least once during the predetermined interval.

9. The method of claim 8, further comprising:
   measuring a voltage of a battery a plurality of times;
   determining whether or not a current change width of the battery during the first time period is within a third range; and
   determining whether or not a voltage change width of the battery during the first time period is within a fourth range,
   wherein the determining of whether or not the internal short occurs is performed when the current change width of the battery during the first time period is within the third range and when the voltage change width of the battery during the first time period is within the fourth range.

10. The method of claim 8, further comprising:
    determining whether or not a difference between a first voltage value of the battery during the first time period and a second voltage value of the battery during the second time period is equal to or less than a second threshold,
    wherein the determining of whether or not the internal short occurs is performed when the difference between the first voltage value and the second voltage value is equal to or less than the second threshold.

11. The method of claim 9, further comprising determining whether a state of the battery is the constant voltage (CV) charging by using voltage values and current values of the battery.

12. The method of claim 11, wherein the determining that the state of the battery is the constant voltage (CV) charging is based on determining that a charging voltage of the battery is at a constant value and a charging current of the battery is gradually decreased.

13. The method of claim 8, wherein:
    the determining of whether or not the internal short occurs includes,
    determining that the internal short occurs in the battery when a value acquired by subtracting the first current value from the second current value is equal to or more than a third threshold, and
    the first current value is an average of current values of the battery measured during the first time period and the second current value is an average of the current values of the battery measured during the second time period or
    the first current value is an instantaneous current value of the battery measured during the first time period and the second current value is the instantaneous current value of the battery measured during the second time period, and
    the third threshold is a real number larger than 0.

14. The method of claim 8, further comprising interrupting a connection between the battery and a charging apparatus of the battery to prevent a thermal runaway of the battery based on determining that the internal short of the battery has occurred.

15. A method for detecting an internal short of a battery, the method comprising:
    measuring a voltage and a current of the battery a plurality of times;
    determining whether or not the battery is being charged based on the voltage and the current of the battery; and
    determining whether or not the internal short of the battery occurs based on a difference between a first voltage value of the battery during a first time period and a second voltage value of the battery during a second time period after a threshold time elapsed from a charging termination time point of the battery,
       wherein the second time period is a time period after the first time period,
    wherein the first time period and the second time period are determined so that a predetermined interval exists between the first time period and the second time period, and
wherein the voltage of the battery is measured at least once during the predetermined interval.

16. The method of claim 15, further comprising:
    determining whether or not there is a charging current supplied to the battery during the first time period and the second time period; and
    determining whether or not a discharging current of the battery is equal to or less than a fourth threshold during the first time period and the second time period,
    wherein the determining of whether or not the internal short occurs is performed when there is no charging current supplied to the battery during the first time period and the second time period and the discharging current of the battery is equal to or less than the fourth threshold during the first time period and the second time period.

17. The method of claim 16, further comprising:
    determining whether or not a difference between a first current value during the first time period and a second current value during the second time period is equal to or less than a fifth threshold,
    wherein the determining of whether or not the internal short occurs is performed when the difference between the first current value and the second current value is equal to or less than the fifth threshold, and
    the first current value is an average of current values of the battery measured during the first time period and the second current value is an average of the current values of the battery measured during the second time period or
    the first current value is an instantaneous current value of the battery measured during the first time period and the second current value is the instantaneous current value of the battery measured during the second time period.

18. The method of claim 17, further comprising:
determining whether or not a voltage change width of the battery during the first time period is within a fifth range,
wherein the determining of whether or not the internal short occurs is performed when the voltage change width of the battery during the first time period is within the fifth range.

19. The method of claim 17, further comprising determining whether or not a first voltage group is stable based on determining that the difference between the first current value during the first time period and a second current value during the second time period is equal to or less than the fifth threshold, wherein the first voltage group comprises voltage values of the battery measured during the first time period.

20. The method of claim 15, wherein the determining of whether or not the internal short occurs includes:
determining that the internal short occurs in the battery when a value acquired by subtracting the second voltage value from the first voltage value is equal to or more than a sixth threshold; and
the first voltage value is an average of voltage values of the battery measured during the first time period and the second voltage value is an average of the voltage values of the battery measured during the second time period or
the first voltage value is an instantaneous voltage value of the battery measured during the first time period and the second voltage value is the instantaneous voltage value of the battery measured during the second time period, and
the sixth threshold is a real number larger than 0.

21. The method of claim 15, further comprising interrupting a connection between the battery and a charging apparatus of the battery to prevent a thermal runaway of the battery based on determining that the internal short of the battery has occurred.

22. An apparatus for controlling a battery, the apparatus comprising:
a measuring unit configured to measure a voltage and a current of the battery a plurality of times; and
a detecting unit configured to determine that an internal short of the battery occurs based on a difference between a first voltage value of the battery during a first time period of the battery and a second voltage value during a second time period when the battery is in constant current charging,
wherein the second time period is a time period after the first time period,
wherein the first time period and the second time period are determined so that a predetermined interval exists between the first time period and the second time period, and
wherein the measuring unit measures the voltage of the battery at least once during the predetermined interval.

23. The apparatus of claim 22, wherein the detecting unit is configured to detect the internal short of the battery using the first voltage value and the second voltage value when a current change width of the battery during the first time period and the current change width of the battery during the second time period are within a first range and a voltage change width of the battery during the first time period is within a second range.

24. The apparatus of claim 22, wherein:
the first voltage value is an average of voltage values of the battery measured during the first time period and the second voltage value is an average of the voltage values of the battery measured during the second time period or
the first voltage value is an instantaneous voltage value of the battery measured during the first time period and the second voltage value is the instantaneous voltage value of the battery measured during the second time period.

25. The apparatus of claim 24, wherein:
the detecting unit is configured to determine that the internal short occurs in the battery when a value acquired by subtracting the second voltage value from the first voltage value is equal to or more than a first threshold, and
the first threshold is a real number larger than 0.

26. The apparatus of claim 22, wherein a control unit connected to the detecting unit is configured to interrupt a connection between the battery and a charging apparatus of the battery to prevent a thermal runaway of the battery based on determining that the internal short of the battery has occurred.

27. The apparatus of claim 22, wherein the detecting unit is further configured to determine whether a state of the battery is the constant current (CC) charging by using voltage values and current values of the battery measured by the measuring unit.

28. The apparatus of claim 27, wherein the detecting unit is further configured to determine whether the state of the battery is the constant current (CC) charging based on determining that a charging current of the battery holds a predetermined value and the voltage of the battery is gradually increased.

29. An apparatus for controlling a battery, the apparatus comprising:
a measuring unit configured to measure a voltage and a current of the battery a plurality of times; and
a detecting unit configured to determine whether or not an internal short of the battery occurs based on a difference between a first current value during a first time period of the battery and a second current value during a second time period when the battery is in constant voltage charging,
wherein the second time period is a time period after the first time period,
wherein the first time period and the second time period are determined so that a predetermined interval exists between the first time period and the second time period, and
wherein the measuring unit measures the current of the battery at least once during the predetermined interval.

30. The apparatus of claim 29, wherein:
the detecting unit is configured to detect the internal short of the battery using the first current value and the second current value when a current change width of the battery during the first time period is within a third range and a voltage change width of the battery during the first time period is within a fourth range.

31. The apparatus of claim 30, wherein:
the detecting unit is configured to detect the internal short of the battery using the first current value and the second current value when a difference between a first voltage value of the battery during the first time period and a second voltage value during the second time period is equal to or less than a second threshold.

32. The apparatus of claim 29, wherein:
the detecting unit is configured to determine that the internal short occurs in the battery when a value acquired by subtracting the first current value from the second current value is equal to or more than a third threshold, and the first current value is an average of current values of the battery measured during the first time period and the second current value is an average of the current values of the battery measured during the second time period or the first current value is an instantaneous current value of the battery measured during the first time period and the second current value is the instantaneous current value of the battery measured during the second time period, and the third threshold is a real number larger than 0.

33. The apparatus of claim 29, wherein the detecting unit is further configured to interrupt a connection between the battery and a charging apparatus of the battery to prevent a thermal runaway of the battery based on determining that the internal short of the battery has occurred.

34. The apparatus of claim 29, wherein the detecting unit is further configured to determine whether a state of the battery is the constant voltage (CV) charging by using voltage values and current values of the battery measured by the measuring unit.

35. The apparatus of claim 34, wherein the detecting unit is further configured to determine whether the state of the battery is the constant voltage (CV) charging based on determining that a charging voltage of the battery is at a constant value and a charging current of the battery is gradually decreased.

36. An apparatus for controlling a battery, the apparatus comprising:
a measuring unit configured to measure a voltage and a current of the battery a plurality of times; and
a detecting unit configured to determine whether or not an internal short of the battery occurs based on a difference between a first voltage value of the battery during a first time period of the battery and a second voltage value of the battery during a second time period after a threshold time elapsed from a charging termination time point of the battery,
wherein the second time period is a time period after the first time period,
wherein the first time period and the second time period are determined so that a predetermined interval exists between the first time period and the second time period, and
wherein the measuring unit measures the voltage of the battery at least once during the predetermined interval.

37. The apparatus of claim 36, wherein:
the detecting unit is configured to detect the internal short of the battery using the first voltage value and the second voltage value when there is no charging current supplied to the battery during the first time period and the second time period and a discharging current of the battery is equal to or less than a fourth threshold during the first time period and the second time period.

38. The apparatus of claim 37, wherein:
the detecting unit is configured to detect the internal short of the battery using the first voltage value and the second voltage value when a difference between a first current value during the first time period and a second current value during the second time period is equal to or less than a fifth threshold, and the first current value is an average of current values of the battery measured during the first time period and the second current value is an average of the current values of the battery measured during the second time period or the first current value is an instantaneous current value of the battery measured during the first time period and the second current value is the instantaneous current value of the battery measured during the second time period.

39. The apparatus of claim 38, wherein the detecting unit is configured to detect the internal short of the battery using the first voltage value and the second voltage value when a voltage change width of the battery during the first time period is within a fifth range.

40. The apparatus of claim 39, wherein the detecting unit is further configured to determine whether or not a first voltage group is stable based on determining that the difference between the first current value during the first time period and a second current value during the second time period is equal to or less than the fifth threshold, wherein the first voltage group comprises voltage values of the battery measured during the first time period.

41. The apparatus of claim 36, wherein:
the detecting unit is configured to determine that the internal short occurs in the battery when a value acquired by subtracting the second voltage value from the first voltage value is equal to or more than a sixth threshold, and the first voltage value is an average of voltage values of the battery measured during the first time period and the second voltage value is an average of the voltage values of the battery measured during the second time period or the first voltage value is an instantaneous voltage value of the battery measured during the first time period and the second voltage value is the instantaneous voltage value of the battery measured during the second time period, and the sixth threshold is a real number larger than 0.

42. The apparatus of claim 36, wherein the detecting unit is further configured to interrupt a connection between the battery and a charging apparatus of the battery to prevent a thermal runaway of the battery based on determining that the internal short of the battery has occurred.

* * * * *

UNITED STATES PATENT AND TRADEMARK OFFICE
CERTIFICATE OF CORRECTION

PATENT NO. : 11,035,904 B2
APPLICATION NO. : 16/517257
DATED : June 15, 2021
INVENTOR(S) : Young Shin Cho et al.

It is certified that error appears in the above-identified patent and that said Letters Patent is hereby corrected as shown below:

In the Claims

Column 19, Line 37, Claim 10    Delete "claim 8",
Insert --claim 9--

Signed and Sealed this
Fourteenth Day of June, 2022

Katherine Kelly Vidal
*Director of the United States Patent and Trademark Office*